United States Patent [19]

Hruby, Jr.

[11] Patent Number: 4,591,020

[45] Date of Patent: May 27, 1986

[54] LOUDSPEAKER ENCLOSURE WITH ISOLATION OF LOUDSPEAKER VIBRATION

[76] Inventor: John O. Hruby, Jr., 1240 Alta Paseo, Burbank, Calif. 91501

[21] Appl. No.: 744,287

[22] Filed: Jun. 12, 1985

Related U.S. Application Data

[63] Continuation of Ser. No. 608,888, May 10, 1984, which is a continuation of Ser. No. 118,596, Feb. 4, 1980, Pat. No. 4,509,615.

[51] Int. Cl.[4] .......... H05K 5/00

[52] U.S. Cl. .......... 181/145; 181/146; 181/148; 181/150; 181/151; 181/153; 181/199

[58] Field of Search .......... 181/144–156, 181/171, 172, 199; 381/88–90

[56] References Cited

U.S. PATENT DOCUMENTS

| | | | |
|---|---|---|---|
| 1,837,755 | 12/1931 | Carlisle et al. | 181/151 X |
| 2,217,279 | 10/1940 | Karns | 181/145 |
| 2,552,309 | 5/1951 | Carlson et al. | 181/148 |
| 2,632,055 | 3/1953 | Parker | 181/147 X |
| 2,802,764 | 8/1957 | Slayter et al. | 179/180 |
| 2,969,848 | 1/1961 | Farwell | 181/145 |
| 3,129,782 | 4/1964 | Stonewell | 181/144 |
| 3,470,976 | 10/1969 | Brevard | 181/171 |
| 3,757,890 | 9/1973 | Dunning | 181/172 X |
| 3,779,337 | 12/1973 | Gregory | 181/151 |
| 3,824,343 | 7/1974 | Dahlquist | 179/1 E |
| 3,927,261 | 12/1975 | Dahlquist | 179/1 E |
| 4,031,318 | 6/1977 | Pitre | 181/145 X |
| 4,127,751 | 11/1978 | Kinoshita | 181/151 X |
| 4,139,076 | 2/1979 | Hruby | 181/151 |
| 4,161,995 | 7/1979 | Pohlmann et al. | 181/150 |
| 4,167,985 | 9/1979 | Dunlavy | 181/148 |

FOREIGN PATENT DOCUMENTS

| | | | |
|---|---|---|---|
| 232467 | 3/1959 | Australia | 181/148 |
| 2414499 | 2/1976 | Fed. Rep. of Germany | 179/1 E |
| 1245024 | 9/1960 | France | 181/145 |
| 434563 | 9/1935 | United Kingdom | 181/151 |
| 790998 | 2/1958 | United Kingdom | 179/1 E |

OTHER PUBLICATIONS

Augsperger, "Exponential Baffles for Custom Installations" Nov. 1951, p. 25.

Sales brochure for Dahlquist Model DQ-6 Speaker System, 1975.

Audio Engineering, vol. 35, No. 11, Nov. 1951, p. 34, "Direct Radiator Loudspeaker Enclosures", H. F. Olson.

*Primary Examiner*—Benjamin R. Fuller

*Attorney, Agent, or Firm*—Christie, Parker & Hale

[57] ABSTRACT

A multi-chamber loudspeaker enclosure comprises a primary chamber having a principle interior volume and a secondary chamber having a minor interior volume substantially smaller than the principal interior volume. The secondary chamber comprises an elongated housing mounted to a front wall of the primary chamber. The secondary chamber has a speaker mounting opening from the enclosure and an interior opening that opens simply and directly from the secondary chamber into the primary chamber. The two openings are substantially coaxially aligned. The speaker mounting opening is the only opening from the inside of the enclosure to its exterior. The secondary chamber projects from one of the faces of the front wall of the primary chamber. The length of the secondary chamber between the two openings is substantially greater than the length of a loudspeaker mountable in the speaker mounting opening. This multichamber loudspeaker enclosure has enhanced freedom from resonance. A loudspeaker enclosure especially suitable for enhancing bass response is provided by a secondary chamber housing of large mass in which the walls are formed from a dense, solid material that inhibits physical motion or vibration being transmitted to the walls of the enclosure from vibrations induced in the loudspeaker during its operation.

23 Claims, 18 Drawing Figures

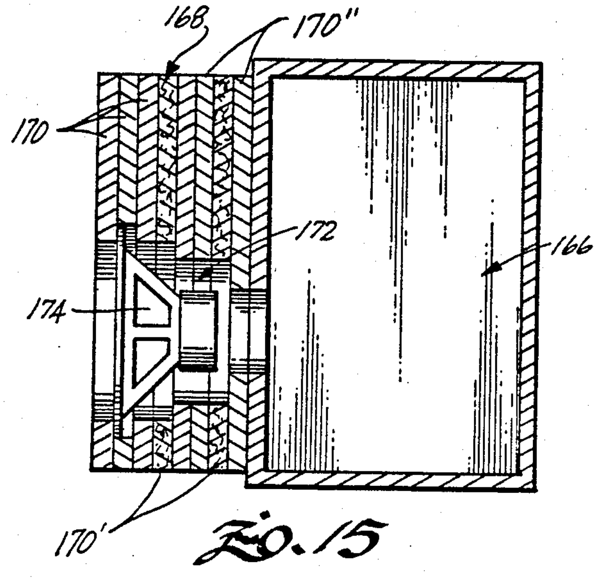
Fig. 15
Fig. 16
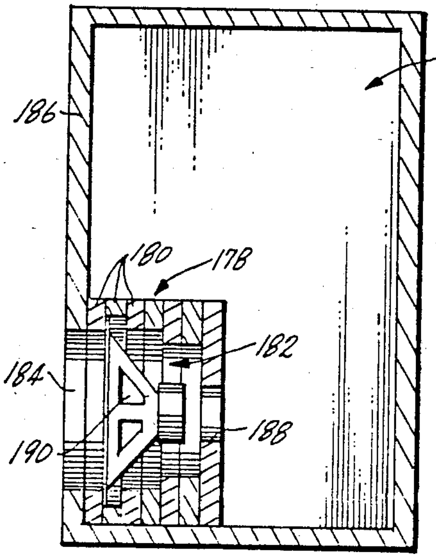
Fig. 17
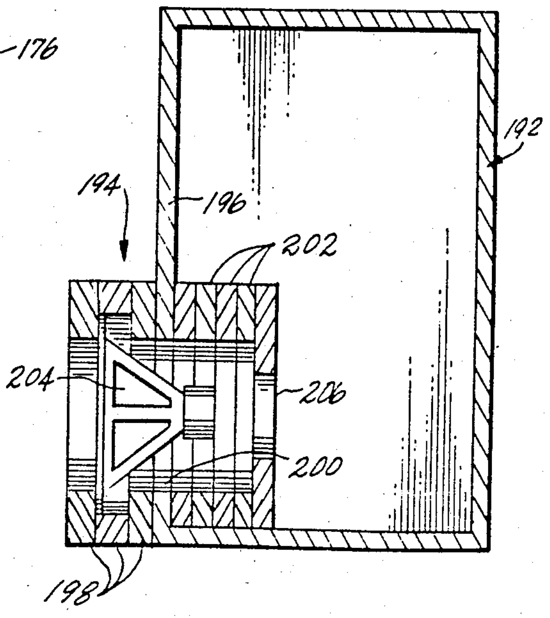

LOUDSPEAKER ENCLOSURE WITH ISOLATION OF LOUDSPEAKER VIBRATION

CROSS-REFERENCE TO RELATED PATENTS AND INCORPORATION BY REFERENCE

This application is a continuation of copending patent application Ser. No. 608,888 filed May 10, 1984, which application was a continuation of prior copending application Ser. No. 118,596 filed Feb. 4, 1980 now U.S. Pat. No. 4,509,615.

FIELD OF THE INVENTION

This invention relates to loudspeaker enclosures. More particularly, the invention relates to loudspeaker enclosures having enhanced freedom from resonance over a large range of frequencies generally in the audio range. One embodiment of the invention provides isolation of loudspeaker vibration from the principal walls of the enclosure.

This application is related to the subject matter of my U.S. Pat. No. Re. 31,483 issued Jan. 3, 1984, which is incorporated herein by this reference. The reissue patent is a reissue of my U.S. Pat. No. 4,139,076 issued Feb. 3, 1979.

BACKGROUND OF THE INVENTION

Loudspeakers are intended to accurately reproduce sound over the full spectrum of the audio range. The full spectrum of musical sound covers a range from about 20-30 Hertz (Hz) in the bass to about 14,000-20,000 Hz or so in the treble. This is the range in which most instruments produce the fundamental tones and combination of overtones that give them their distinctive sound. A measure of a loudspeaker's accuracy of sound reproduction is its ability to change electrical input signals into sound that corresponds almost exactly to those input signals. A loudspeaker should not alter or color the sound intended, but this is a common problem with present loudspeakers. For example, different loudspeakers can have similar accuracy of response over the audio frequency range, but they can sound entirely different from one another. This indicates that the sound reproduction is being colored by the different loudspeaker designs.

Great care is taken in the modern recording industry to cause the sound recorded on a phonograph record or take to correspond, in frequency and volume, as faithfully as possible to the sound of the performance reproduced in the recording. Similarly, modern electronic audio equipment (amplifiers and the like) are extremely linear over their operating ranges, and they faithfully amplify and generate output signals that also faithfully correspond to the sound in the recording. A loudspeaker system used to transduce the electrical output of the audio amplifier to an audible signal should not color the sound, since this subverts the care taken in the original recording and in the reproduction amplifiers.

Resonances and vibrations in the loudspeaker system color the sound intended. I have discovered that the structure of the loudspeaker enclosure itself is a principal source of resonances and vibrations in the loudspeaker system. Sound coloration can be caused by objectional resonances of the loudspeaker enclosure at one or more frequencies within the frequency range of their operation. Loudspeaker resonances result in boominess of the speaker, which is not consistent with faithful reproduction of the sound intended. Sound coloration also can be caused by physical motion or vibration transferred to the walls of the speaker enclosure from vibrations induced in the loudspeaker during operation.

A need therefore exists for an improved loudspeaker enclosure which, when used in combination with a loudspeaker, reproduces sound over the intended frequency range without objectionable resonances and without significant physical motion or vibration being transmitted to the walls of the speaker enclosure from vibrations of the loudspeaker.

My U.S. Pat. No. 4,139,076 meets these needs by providing a loudspeaker enclosure with improved freedom from resonance. The loudspeaker enclosure in my patent includes a housing having a principal volume and substantially smaller minor volume. The minor volume is provided by a small chamber that projects essentially entirely beyond the front wall of the principal volume. The front wall of the small chamber provides a speaker mounting opening. To the extent that my earlier patent requires the small chamber to project entirely beyond the front wall of the principal volume, it has since been recognized that this is a special case of a broader development. It has been discovered that the benefits of my developments in loudspeaker enclosures can be realized by enclosures having other configurations, and the purpose of this application is to disclose configurations which comprise this broader development.

SUMMARY OF THE INVENTION

This invention provides an improved loudspeaker enclosure which is particularly useful in the reproduction of sound with reduced coloration from resonances within the audio frequency range or from physical motion of vibrations induced or generated in the enclosure structure by vibrations occurring in loudspeakers mounted in the enclosure. In one embodiment, the improved loudspeaker enclosure is particularly useful in the reproduction of sound in the bass or low frequency range. Another embodiment of the present invention is useful in providing improved reproduction of the so-called mid-range audio frequencies.

A loudspeaker according to the present invention has one or more of several structural features in the context of a basic enclosure structure. The basic enclosure structure comprises a primary chamber which defines a principal interior volume of the enclosure, and a secondary chamber which defines a minor interior volume which is substantially smaller than the principal volume. The primary chamber has a front wall with inner and outer faces, the inner face forming a front boundary of selected height and width for the principal volume. The secondary chamber is defined in an elongate housing which is essentially permanently sealed to the primary chamber front wall to project beyond at least one of the faces of that wall. Two openings are associated with the secondary chamber. A speaker mounting opening opens essentially directly to the outside of the enclosure from a front boundary of the minor volume and is the only opening to the exterior of the enclosure from the combination of the primary and secondary chambers. A second opening opens simply and directly from the minor volume only to the principal volume through a rear boundary of the minor volume. The two openings are substantially coaxially aligned. The second opening has height and width dimensions which are less than, and are in directions respectively parallel to the height and width dimensions of the front boundary of the principal volume. The length of the minor volume between the two openings associated with it is substantially greater than the length of a loudspeaker mountable in the speaker mounting opening.

In the context of the foregoing basic enclosure structure, an enclosure embodying the discoveries and teachings of the present invention, to the extent they are structurally compatible and consistent with each other, has at least one of the following features and characteristics:

- the primary chamber is comprised by a relatively smaller and a relatively larger volume located, respectively, next adjacent to and spaced from the minor volume within the enclosure;
- the secondary chamber housing structure has a density at least about twice that of the primary chamber structure;
- the secondary chamber average wall thickness is greater than the primary chamber average wall thickness;
- the portion of the secondary chamber housing which defines the speaker mounting opening is of substantially greater rigidity than the primary chamber front wall; and
- the walls of the secondary volume have greater volume than the secondary chamber itself.

These loudspeaker enclosures are remarkably free from resonances over the audio frequency range within which they are principally used regardless, as a general rule, of the quality or cost of the loudspeaker mounted in or to the enclosure. That is, as a general rule, a present loudspeaker enclosure enables a relativelylow-cost loudspeaker to be used to reproduce sound as realistic as, or better than, that obtained with the higher-priced speakers now commercially available. A present loudspeaker enclosure is structurally simple and therefore it can be manufactured at a reasonable cost. So far as I can ascertain, a present enclosure is not dependent upon critical geometrical relationships, although there are certain geometrical relationships which I have discovered to be important. Enclosures applying this invention are useable with a wide range of loudspeaker sizes, and the more important relationships which I have discovered enable the dimensions of the enclosure to be adjusted to correspond to the size of a particular loudspeaker, without significant variation in the performance of the enclosure from size to size. This invention also permits variations in materials used in the loudspeaker to alter the type of sound produced by the loudspeaker, if desired.

DRAWINGS

The above-mentioned and other features of this invention are more fully set forth in the following detailed description of presently preferred embodiments of the invention, which description is presented with reference to the accompanying drawings, wherein:

FIG. 15 is a cross-sectional view showing a second embodiment of a loudspeaker enclosure similar to that shown in FIG. 10;

FIG. 16 is a cross-sectional view showing a third embodiment of a loudspeaker enclosure similar to that shown in FIG. 10;

FIG. 17 is a cross-sectional view showing a fourth embodiment of a loudspeaker enclosure similar to that shown in FIG. 10.

DETAILED DESCRIPTION

Figure 1:
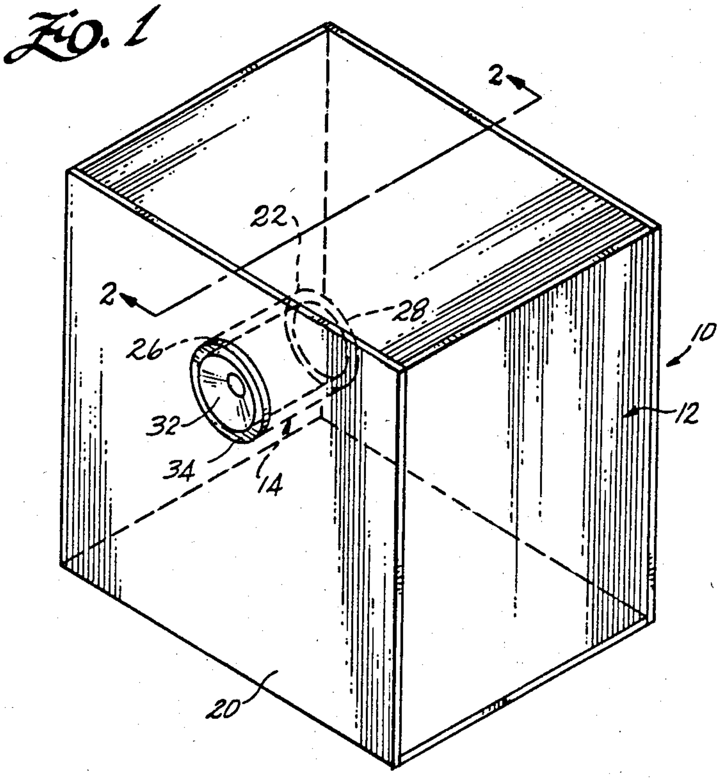
FIG. 1 is a perspective view showing one embodiment of a loudspeaker enclosure having a primary chamber and a secondary chamber according to principles of this invention.
Figure 2:
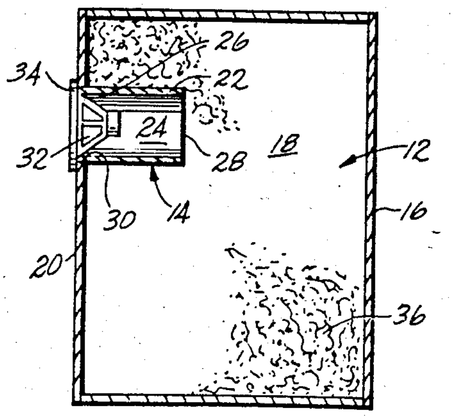
FIG. 2 is a cross-sectional view taken on line 2—2 of FIG. 1.

FIGS. 1 and 2 illustrate one embodiment of a loudspeaker enclosure 10 according to principles of this invention. The enclosure includes a primary chamber 12 having a principal interior volume and a secondary chamber 14 having a minor interior volume substantially smaller than the primary interior volume. The primary chamber 12 is defined by a housing 16 enclosing a hollow interior 18 that defines the principal interior volume. The primary chamber housing is preferably of rectilinear or cubical configuration. The walls of the primary chamber housing are preferably constructed from a rigid, dense material, preferably particle board assembled by gluing and/or by wood screws. The primary chamber housing includes a generally planar front wall 20.

The secondary chamber 14 is mounted to the primary chamber front wall 20. The secondary chamber is defined by an elongated housing 22 having a hollow interior 24 that defines the minor interior volume. The secondary chamber housing extends generally perpendicular to the plane of the primary chamber front wall. The secondary chamber housing can be of a variety of configurations such as rectilinear, cubical or cylindrical. In the preferred embodiment, the secondary chamber housing is cylindrical, as illustrated in FIGS. 1 and 2. The walls of the secondary chamber housing are preferably constructed from a rigid, dense material. In the cylindrical configuration, the preferred material is wood or hard plastic, such as ABS or polyvinyl chloride. The secondary chamber housing also can be constructed of particle board, as in the rectilinear configuration disclosed in my U.S. Pat. No. Re. 31,483.

The secondary chamber housing 22 is substantially longer than the average wall thickness of the primary chamber front wall 20. Thus, the secondary chamber housing projects beyond at least one face of the primary chamber front wall. Opposite ends of the secondary chamber housing define an exterior opening 26 that opens toward the exterior of the loudspeaker enclosure and an interior opening 28 that opens directly from the hollow interior 24 of the secondary chamber housing into the hollow interior 18 of the primary chamber housing 16. The exterior opening of the secondary chamber is referred to herein as a speaker mounting opening. The hollow interior 18 of the primary chamber and the hollow interior 24 of the secondary chamber are completely sealed from the exterior of the loudspeaker enclosure, except for the presence of the speaker mounting opening, which communicates to the exterior of the loudspeaker enclosure. The speaker mounting opening provides the only opening from the interior of the enclosure to the exterior of the enclosure.

The secondary chamber housing 22 can be mounted to the front wall 20 of the primary chamber housing such that either the speaker mounting opening 26, or the interior opening 28 of the secondary chamber housing, project beyond the front face or the inside face of the primary chamber front wall 20, respectively. FIGS. 1 and 2 illustrate one embodiment in which the speaker mounting opening 26 is essentially in the plane of the primary chamber front wall, and the interior opening 28 of the secondary chamber housing is located in the hollow interior 18 of the primary chamber housing, spaced inwardly from the inside face of the primary chamber front wall. The secondary chamber housing is coaxial with and sealed to an opening or port 30 of essentially the same size as the outside diameter of the secondary chamber housing. The secondary chamber is preferably sealed to the front wall by gluing or otherwise adhesively bonding it around its exterior to the inside surface of the port 30. This provides an airtight or acoustical seal surrounding the secondary chamber housing. The speaker mounting opening is adapted to be exterior of the primary chamber, in the sense that a loudspeaker sealed to the speaker mounting opening can face exterior of the primary chamber, while sealing the interior of the primary chamber from the exterior of the enclosure 10.

In using the enclosure 10, a loudspeaker 32 is mounted in the speaker mounting opening 26 of the secondary chamber housing 22. The loudspeaker is mounted in an airtight manner to the annular front edge of the secondary chamber housing, in which an annular rear face of a speaker mounting flange 34 is affixed to the front edge of the secondary chamber housing. The engagement of the speaker mounting flange to the secondary chamber housing is made in an airtight manner by a gasket which is typically provided on the rear face of the mounting flange. The loudspeaker can be affixed by circumferentially spaced apart wood screws (not shown), or by adhesively bonding it, although other means of sealing the loudspeaker in the speaker mounting opening can be used.

The secondary chamber housing is preferably mounted on the vertical center axis of the primary chamber front wall, while being offset from the geometric center of the front wall by mounting it closer to the top of the speaker enclosure than to the bottom. Such an offset configuration is preferred, in terms of speaker response, when compared to a similar configuration in which the secondary chamber opening is located at the geometric center of the primary chamber front wall.

At least the interior surfaces of the primary chamber housing are covered with at least a one-inch thickness of acoustical packing material such a fiberglass padding 36. However, it is preferred to essentially fill the entire hollow interior 18 of the primary chamber with such acoustical packing material, save for any portion of the secondary chamber housing which protrudes into the interior of the primary chamber. Essentially the entire hollow interior 24 of the secondary chamber housing is void, i.e., devoid of any such acoustical material. The acoustical packing material inhibits undesired sound reflections in the interior of the loudspeaker enclosure.

It is preferred that the inside diameter of the secondary chamber housing 22 be as close to the diameter of the speaker cone as possible. It has been discovered that excellent results, in terms of speaker performance, are obtained with this configuration. Good results, generally, are also obtained when the diameter of the interior opening 28 of the secondary chamber housing is at least about 0.7 the diameter of the speaker mounting opening. In one embodiment, including that shown in FIG. 1, even better results are obtained when the diameter of the interior opening of the secondary chamber housing is about the same as the diameter of the speaker mounting opening. It is also desirable, in terms of freedom from resonances, that the ratio of the minor interior volume to the principal interior volume be less than about 0.20. I have discovered that a reasonably small minor interior volume in relation to the principal interior volume produces a lower resonant frequency of the combination.

Figure 3:
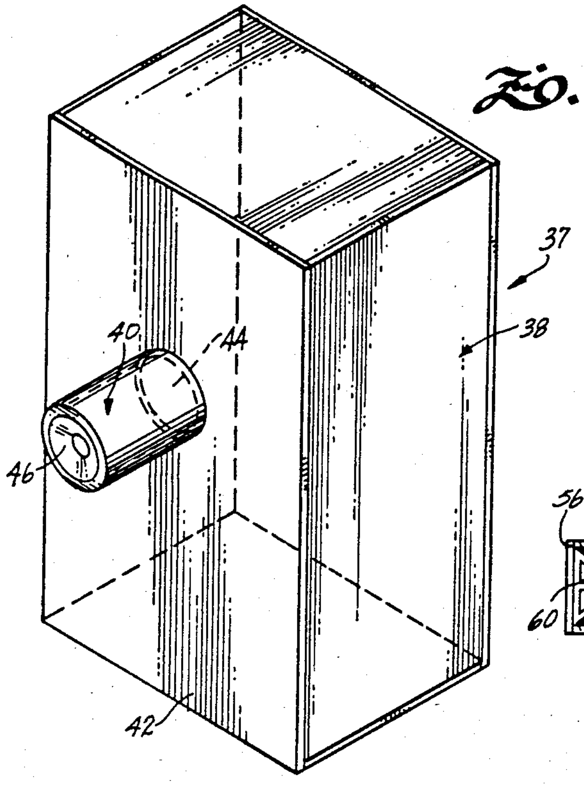
FIG. 3 is a perspective view showing an alternative embodiment of the loudspeaker enclosure, in which the secondary chamber is mounted essentially entirely outside the primary chamber.

FIG. 3 shows a loudspeaker enclosure 37 similar to that shown in FIGS. 1 and 2. In this embodiment, a primary chamber housing 38 similar to the housing 12 provides the principal interior volume, and a secondary chamber housing 40 similar to the secondary chamber housing 14 provides the minor interior volume. The secondary chamber housing 40 projects essentially entirely beyond the front face of a primary chamber front wall 42. The interior of the primary chamber is completely sealed from the exterior of the enclosure, except for the presence of a front wall opening or port 44 which opens into the minor interior volume of the secondary chamber. The minor interior volume of the secondary chamber is completely sealed from the exterior, except for the presence of an interior opening in its rear wall, which is common to the port 44, and except for the presence of an exterior opening in the front of the secondary chamber which provides a speaker mounting opening. A loudspeaker 46 is sealed in an airtight manner to the speaker mounting opening of the secondary chamber 40. The inside diameter of the secondary chamber housing is approximately the same as the diameter of the speaker cone.

The loudspeaker enclosure illustrated in FIG. 3 is similar to the enclosure disclosed in my U.S. Pat. No. Re. 31,483, whereas the loudspeaker enclosure illustrated in FIGS. 1 and 2 is of different structure. The present application is based on a recognition that the secondary chamber need not project entirely beyond the front face of the primary chamber front wall. I have learned through additional development and testing that the benefits of my loudspeaker discovery can be realized by other enclosure configurations as well, and the embodiment of FIGS. 1 and 2 is an example of such a broader development. It has since been realized that improved freedom from resonance can be achieved by my loudspeaker enclosure having the secondary chamber housing sealed to the front wall of the primary chamber such that the secondary chamber housing projects beyond at least one face of the primary chamber front wall.

The loudspeaker enclosures shown in FIGS. 1 through 3 provide unusually clear and accurate sound reproduction that is free of coloration. These speakers provide excellent sound reproduction for mid-range frequencies, i.e, within the range of about 100 Hz to about 3,000 Hz. It is believed that such surprisingly clear sound reproduction is provided because the loudspeaker enclosures are essentially free from resonances over the audio frequency range within which the speaker is operating. This freedom from resonances is believed to be the result of the dual-chamber aspect of the enclosure, i.e., in which the speaker is mounted in the front opening of the elongated housing having a relatively smaller interior volume, which, in turn, opens directly into the interior of the relatively larger principal speaker enclosure. It has been discovered that this dual-chamber combination has a lower resonant frequency than, for example, an enclosure having the same loudspeaker mounted to a planar sounding board of a single loudspeaker enclosure. Moreover, the unusually clean sound provided by my loudspeaker enclosure is produced with relatively inexpensive speakers.

The loudspeaker enclosures according to principles of this invention can be arranged in a variety of other configurations. Of the loudspeaker configurations I have constructed and tested, an embodiment similar to that illustrated in FIG. 3 appears to provide the best sound reproduction, although an embodiment similar to that illustrated in FIGS. 1 and 2 also provided good results. Embodiments of these loudspeaker enclosures have been constructed and tested using a reasonably inexpensive Phillips (Amperex) AD5061M, five-inch diameter mid-range speaker of a type typically used in automobile radio and tape systems. A presently preferred embodiment of a mid-range speaker was constructed using two primary chambers of different volume in a single housing. The primary chambers were sealed from one another, and a separate secondary chamber was sealed to a front wall of each primary chamber. The loudspeakers were sealed to the front ends of five-inch diameter tubes, about three to four inches long, for providing each secondary chamber housing. Each secondary chamber housing was sealed to the same front wall of the primary chamber enclosures, and they were arranged according to the embodiment illustrated in FIG. 3. The primary chambers had overall dimensions of 14 inches high×8 inches wide×8 inches deep; and 10 inches high×8 inches wide×8 inches deep. Each primary chamber was filled with fiberglass acoustical packing, as described above. Excellent mid-range sound reproduction resulted essentially free of resonances induced in the enclosures over the audio frequency ranges tested. This speaker during use produced sound with unusually superior depth and presence, having a definite life-like quality. The same embodiment, but with two primary chambers of the same volume, did not produce as superior sound reproduction, but the results were still extremely good when compared with typical expensive commercial loudspeakers. It is also believed that similar favorable results can be obtained with such a dual enclosure arrangement, in which the secondary chambers and speakers are of different size.

It has also been discovered that the present dual chamber speaker enclosure permits use of a larger sized speaker for a given enclosure volume than the speaker size normally rated for that enclosure size. That is, a speaker size that is normally required for a certain minimum enclosure volume can be increased with the present speaker design, and the same speaker performance obtained.

Figure 4:
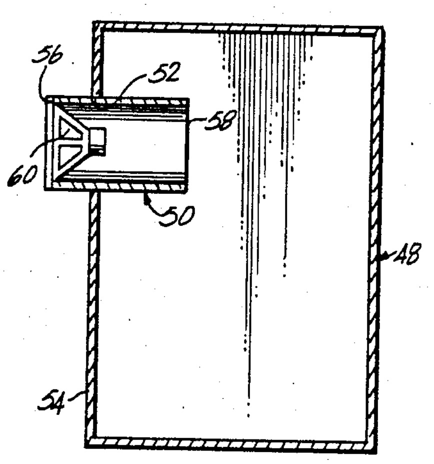
FIG. 4 is a cross-sectional view showing an embodiment of the loudspeaker enclosure, in which the secondary chamber extends through a port in the primary chamber.
Figure 5:
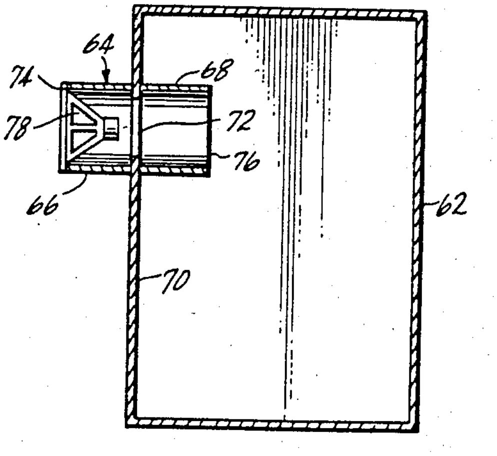
FIG. 5 is an alternative embodiment of the loudspeaker enclosure, in which the secondary chamber is on opposite sides of a front wall of the primary chamber.
Figure 6:
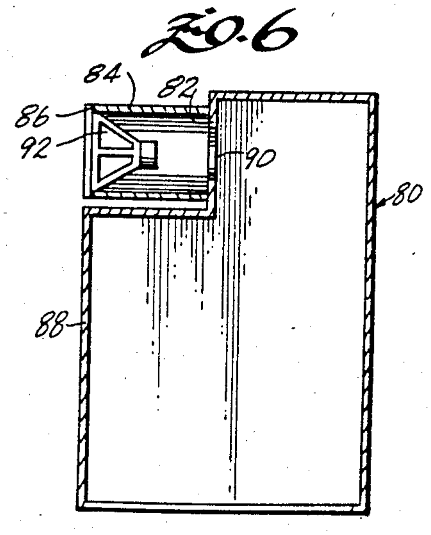
FIG. 6 is a cross-sectional view showing an alternative embodiment of the loudspeaker enclosure, in which the secondary chamber is mounted to a recessed exterior portion of the primary chamber.

FIGS. 4 through 6 illustrate other alternative embodiments of loudspeaker configurations according to principles of this invention. The loudspeaker enclosure of FIG. 4 includes a primary chamber 48 similar to the primary chambers 12 and 38 described above, and a cylindrical secondary chamber housing 50 similar to the secondary chamber housings 14 and 40 described above. The secondary chamber housing 50 is sealed through a circular port 52 in a front wall 54 of the primary chamber housing. A speaker mounting opening 56 exterior of the primary chamber is spaced beyond a front face of the front wall 54, and an interior opening 58 of the secondary chamber housing is spaced beyond the inside face of the front wall 54 in the principal interior volume of the primary chamber. A loudspeaker 60 is sealed to the speaker mounting opening. In the embodiment of FIG. 4 a major length of the secondary chamber housing is located in the hollow interior of the primary chamber, although another embodiment could be provided in which a major length of the secondary housing projects beyond the front face of the primary chamber front wall 54.

FIG. 5 illustrates a loudspeaker enclosure having a primary chamber housing 62 similar to those described above and a secondary chamber housing 64 having an exterior portion 66 and an interior portion 68 mounted to opposite faces of a primary chamber front wall 70. The exterior and interior portions of the secondary chamber housing are preferably of the same inside diameter and are coaxial with a circular port 72 formed in the front wall of the primary chamber housing. An exterior speaker mounting opening 74 on the exterior portion 66 of the secondary chamber is spaced from the front wall of the primary chamber. An interior opening 76 of the interior portion 68 is located in the interior of the primary chamber housing, spaced from an inside face of the primary chamber front wall. A loudspeaker 78 is sealed to the speaker mounting opening. In this embodiment, the port 72 in the front wall is of slightly smaller inside diameter than the inside diameter of the secondary chamber housing.

FIG. 6 illustrates an alternative embodiment in which a primary chamber housing 80 has a recessed front wall portion 82, and an exterior secondary chamber housing 84 is mounted in front of the recessed front wall portion 82. The secondary chamber housing includes a speaker mounting opening exterior of the enclosure and lying substantially in the same plane as a principal front wall portion 88 below the recessed portion. The secondary chamber housing is mounted coaxially adjacent a circular port 90 formed in the recessed wall portion 82. The port 90 is shown with a slightly smaller inside diameter than the inside diameter of the secondary chamber housing, although these diameters can be the same. A loudspeaker 92 is sealed to the speaker mounting opening 86.

In all embodiments shown in FIGS. 4 through 6 the speaker mounting opening is open essentially directly from the interior of the secondary chamber to the exterior of the enclosure; and the speaker mounting is the only opening from the exterior of the enclosure to the interior of the primary and secondary chambers. In these embodiments the interior volume of the secondary chamber housing is substantially less than the interior volume of the primary chamber.

Figure 7:
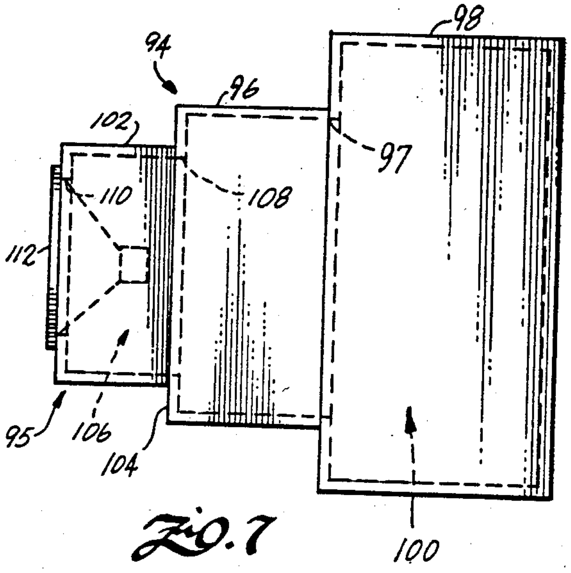
FIG. 7 is a side elevation view showing an alternative embodiment of the loudspeaker enclosure having a pair of primary chambers of different size.

FIG. 7 illustrates a multi-chamber loudspeaker enclosure based on principles of this invention. In this embodiment, the enclosure consists essentially of a stepped primary chamber housing 94 and a secondary chamber housing 95. The stepped primary chamber housing has a relatively smaller enclosure 96 with an interior opening 97 that opens directly into a hollow interior of a relatively larger enclosure 98. The two enclosures have a common hollow interior 100 that provides the principal interior volume of the loudspeaker system. The secondary chamber has a housing 102 that is sealed to a front wall 104 of the relatively smaller enclosure 96. The secondary chamber housing has a minor interior volume 106 that is at least smaller than the total combined interior volume of the smaller and larger housings that make up the primary chamber housing. In the preferred embodiment, the minor interior volume of the secondary chamber is substantially smaller than the interior volume of the smaller enclosure 96. The secondary chamber housing has an interior opening 108 common to an opening or port formed in the front wall 104 of the smaller enclosure 96. The secondary chamber housing also has a speaker mounting opening 110 adjacent the exterior of the enclosure, and a loudspeaker 112 is sealed to the speaker mounting opening. The speaker mounting opening is open essentially directly from the interior of the secondary chamber to the exterior of the enclosure. The speaker mounting opening is the only opening from the exterior of the enclosure to the interior of the primary chamber housing and the secondary chamber housing. In one embodiment, the secondary chamber housing and each portion of the primary chamber housing are each of rectilinear configuration, although the secondary chamber housing and the port 108 can be cylindrical and circular, respectively. Although the loudspeaker enclosure of FIG. 7 can be constructed in a variety of dimensions, in one embodiment the dimensions of the larger primary chamber 98 were 12 inches high×12 inches wide×6 inches deep, the dimensions of the smaller primary chamber enclosure 96 were 8½ inches high×8½ inches wide×4 inches deep, and the dimensions of the secondary chamber housing were 8 inches high×6½ inches wide×3 inches deep. A mid-range speaker having a five-inch diameter cone was sealed in the speaker mounting opening. In use, the system provided excellent results in terms of inhibiting resonances being induced in the enclosure over the audio frequency range of the speaker. It is believed that the addition of the larger enclosure 98 to the smaller enclosure 96 either lowers the resonant frequency, or reduces resonant frequency amplitude of the total combination, when compared with a primary chamber absent the larger enclosure 98. It is believed that similar good results can be obtained with an array having chambers that are not progressively larger in volume, i.e., in which the chamber 96 is smaller than the chamber 102, for example.

Figure 8:
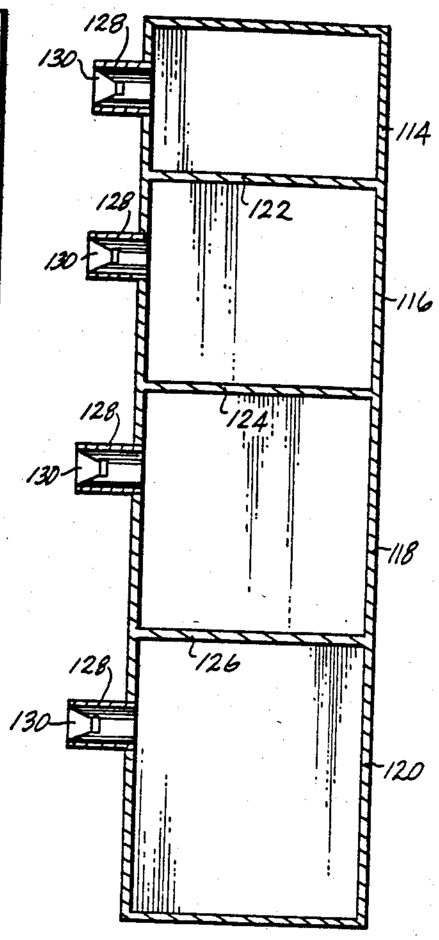
FIG. 8 is a cross-sectional view showing an alternative embodiment of the loudspeaker enclosure having multiple primary chambers.

FIG. 8 shows a loudspeaker array comprising a series of loudspeakers combined in a stacked configuration. In this embodiment, four separate loudspeaker enclosures are combined in a single assembly, although the number of individual enclosures in the array can vary. The four loudspeaker enclosures have primary chambers 114, 116, 118 and 120 of increasingly larger volume. Adjacent pairs of primary chamber housings are divided by common walls 122, 124 and 126. Separate secondary chamber housings 128 open into each primary chamber housing. The secondary chamber housings are all the same size, and a separate identical loudspeaker 130 is sealed to a speaker mounting opening at the front of each secondary chamber housing. In one embodiment, a loudspeaker enclosure of stacked configuration similar to that shown in FIG. 8 can be constructed with five-inch diameter mid-range speakers and with separate primary chambers, each 8 inches wide and 8 inches deep, with varying heights of 8 inches, 10 inches, 12 inches and 14 inches, respectively. By providing such differing major chamber volumes, the tones induced in the speakers blend together to produce a very clean sound free of resonances in the enclosure over the mid-range frequencies.

Figure 9:
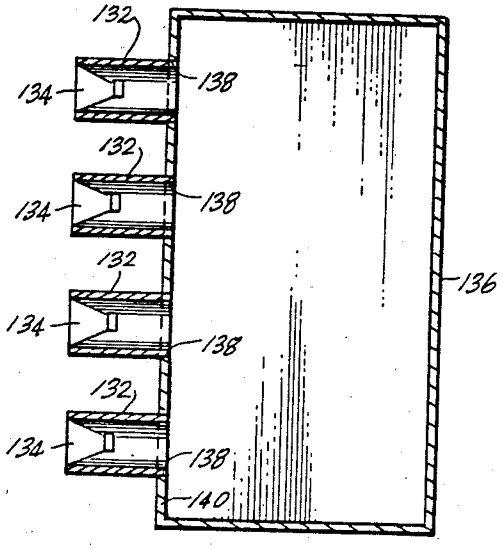
FIG. 9 is a cross-sectional view showing an alternative embodiment of the loudspeaker enclosure having a single primary chamber with multiple secondary chambers.

FIG. 9 shows an embodiment of a loudspeaker enclosure comprising a plurality of secondary chamber housings 132 each being identical to one another and having separate identical loudspeakers 134 sealed to front speaker mounting openings of the secondary chamber housings. In the illustrated embodiment, there are four secondary chamber housings, although this number can vary. The secondary chamber housings all open into a common hollow interior of a single primary chamber housing 136. All secondary chamber housings are sealed to respective openings or ports 138 in a front wall 140 of the primary chamber housing 136. The configuration illustrated in FIG. 9 can be altered by providing secondary chamber housings of varying volumes, or by placing one or more of the secondary chamber housings in the interior of the primary chamber housing, in a manner similar to that loudspeaker shown in FIGS. 1 and 2, or other variations can be provided as illustrated in FIGS. 4 through 6. Such an other variation is to make the several secondary chamber housings of different sizes so that the secondary chambers have volumes different from each other. This enclosure, in which a plurality of secondary chambers open directly into a common hollow interior of a single primary chamber, is the least desirable of the illustrated enclosures using the dual primary and secondary chambers, as described herein; but the enclosure of FIG. 9 is still generally superior to the plain box-type loudspeaker enclosure in which the loudspeaker is mounted directly to a planar sounding board at the front of a single enclosure.

FIGS. 10 through 14 illustrate a loudspeaker enclosure 140 having especially enhanced bass response. Loudspeaker enclosures designed for reproducing relatively low audio frequencies, i.e., in the range of about 100 Hz and below, have long been subject to objectional resonances within the frequency ranges of their operation. For the purposes of this invention, a bass or low frequency loudspeaker or loudspeaker enclosure, is one intended to reproduce sound in the range of from about 250 Hz and below down to the lower limit of the human hearing range, which is in the neighborhood of 15 to 25 Hz, depending upon the individual. A problem encountered with a typical bass loudspeaker and its enclosure is that the combination tends to resonate at one or more frequencies in the frequency range in which it is operated. These resonances result in boominess of the speaker, which is sometimes preferred, but which, nevertheless, is not consistent with the faithful reproduction of the sound intended. Resonances are particularly objectionable in coloring the sound reproduced because lower frequency sounds are accentuated at some frequencies as compared with the relative volume of the sound for those frequencies as intended by the recording. Another problem encountered in a typical bass loudspeaker and its enclosure is that vibrations from the loudspeaker during its operation are transmitted to the wall of the loudspeaker enclosure, causing physical motion or vibration of the walls of the enclosure. Such vibrations, together with resonances at certain frequencies in the base range entirely color the sound of the speaker.

The loudspeaker enclosure 140 is characterized by absence of resonances in the enclosure within the bass frequency range and absence of physical motion or vibrations from operation of the speaker being transmitted to the walls of the enclosure, even when the bass speaker is played at relatively high volume and therefore large vibrations are induced in the speaker.

The loudspeaker enclosure consists essentially of a primary chamber housing 142 having a principal interior volume and a secondary chamber housing 144 affixed to a front wall 146 of the primary chamber housing. The secondary chamber housing has a minor interior volume substantially smaller than the principal interior volume of the primary chamber housing. The primary chamber is similar to the other primary chamber housings described above; and briefly it includes a housing of rectilinear or cubical configuration, preferably constructed from a rigid, dense material such as particle board. The hollow interior space within the primary chamber is preferably filled with an acoustical packing material 148 such as fiberglass. The secondary chamber housing comprises an elongated housing of large wall thickness with a small hollow interior 150. The secondary chamber housing is mounted adjacent a port 152 in the front wall of the primary chamber. The hollow interior of the secondary chamber thus opens directly into the hollow interior of the primary chamber.

Figure 10:
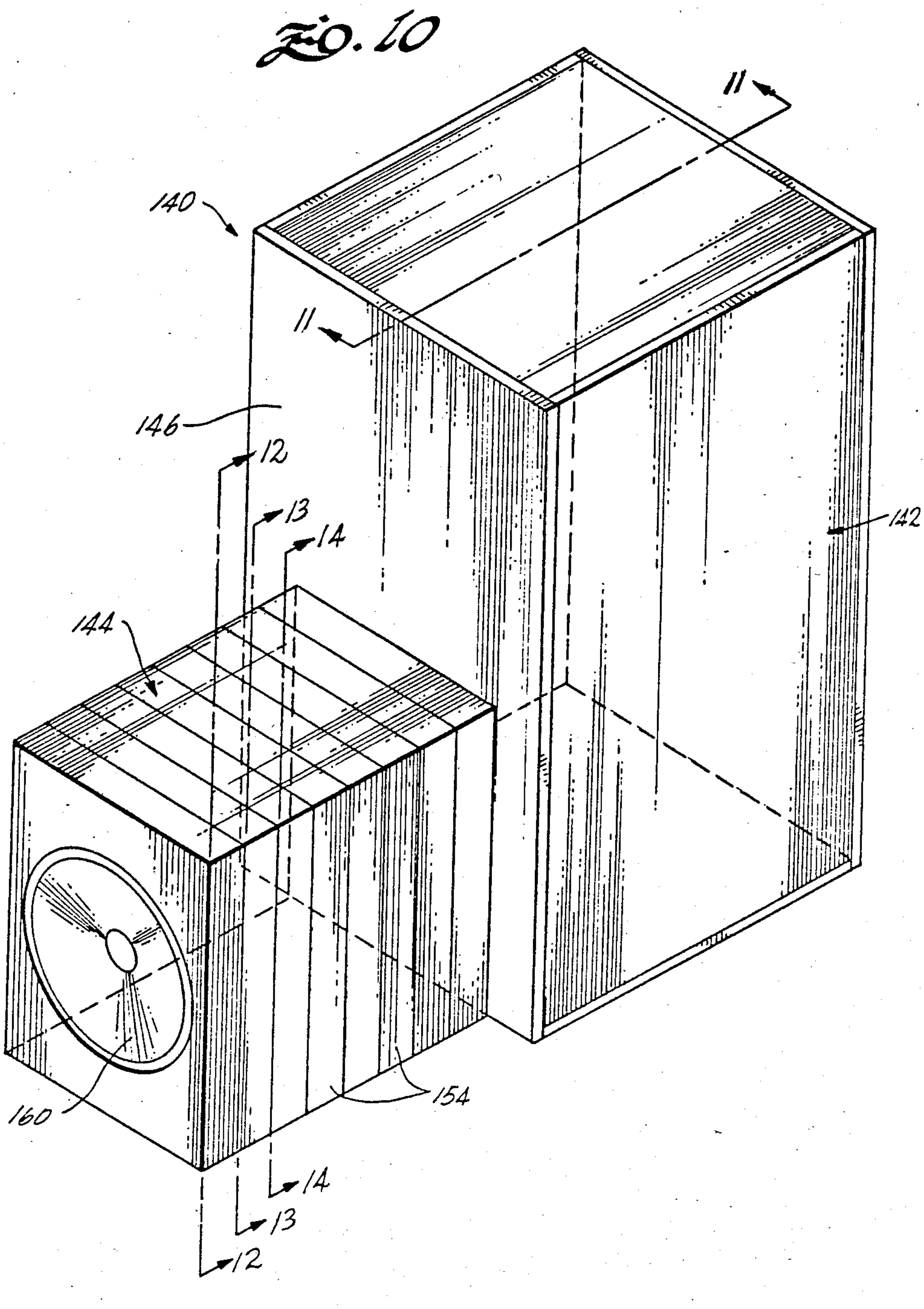
FIG. 10 is a perspective view showing an alternative embodiment of a loudspeaker enclosure which is particularly useful in the reproduction of sound in the bass range, wherein said loudspeaker enclosure includes a secondary chamber formed from a plurality of overlapping wall panels.
Figure 11:
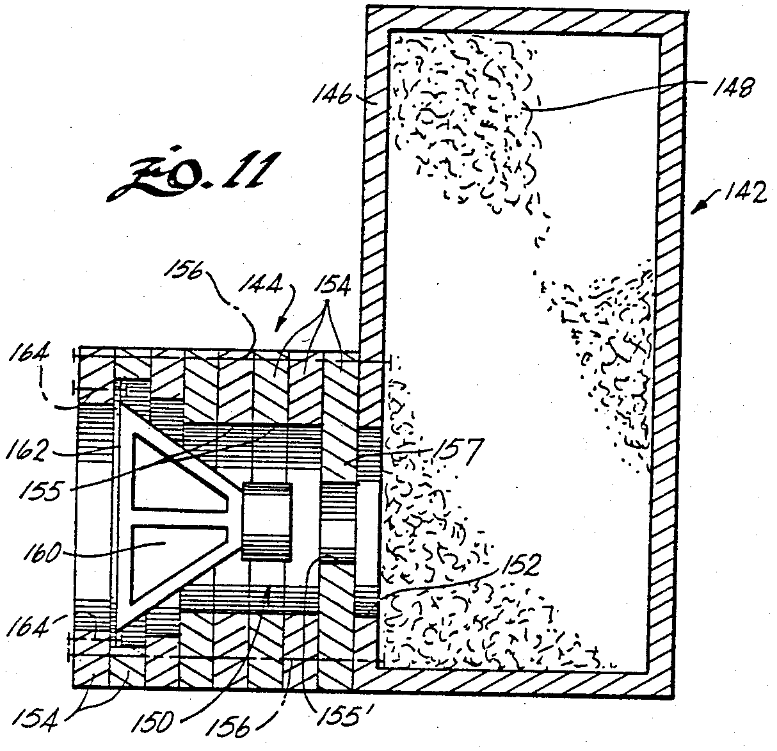
FIG. 11 is a cross-sectional view taken on line 11—11 of FIG. 10.

In the illustrated embodiment, the wall of the secondary chamber housing 144 comprise a plurality of stacked or adjacent panels 154 of a rigid, dense material such as particle board. In the illustrated embodiment, there are eight stacked panels that comprise the secondary chamber housing, although this number can vary. By panels arranged in a stacked configuration is meant that a number of panels with reasonably large projected area are placed face-to-face so their large faces contact one another and are secured to one another as a unit, combining to form a composite housing of reasonably large mass. These stacked panels each have corresponding central openings 155 that combine to form the minor interior volume 150 of the secondary chamber when the panels are assembled side-by-side as shown in FIGS. 10 and 11. The secondary chamber panels 154 can be rigidly affixed to the front wall of the primary chamber by various means. In the illustrated embodiment, a number of through bolts 156 extend the length of the secondary chamber housing through the stacked panels and through the front wall of the primary chamber housing. Cooperating fasteners (not shown) are tightened on the through bolts to rigidly secure the stacked panels to the front wall of the primary chamber housing.

Figure 12:
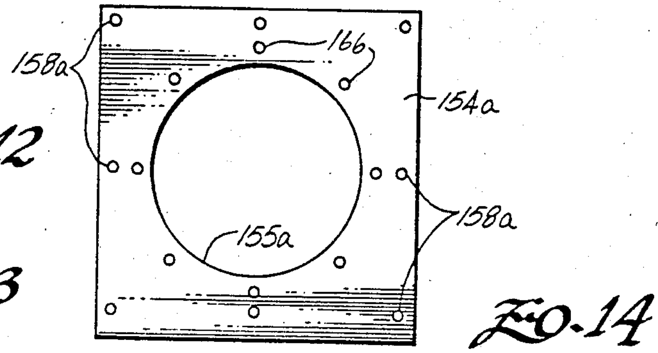
FIG. 12 is an elevation view showing a secondary chamber panel as viewed from line 12—12 in FIG. 10.
Figure 13:
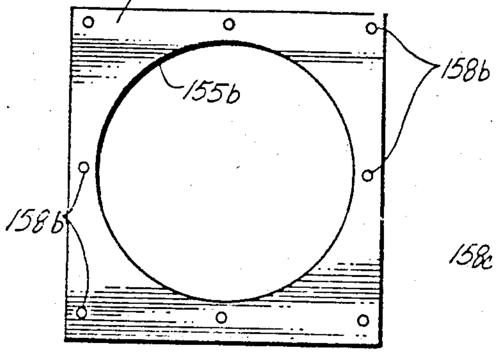
FIG. 13 is an elevation view showing a secondary chamber panel as viewed on line 13—13 of FIG. 10.
Figure 14:
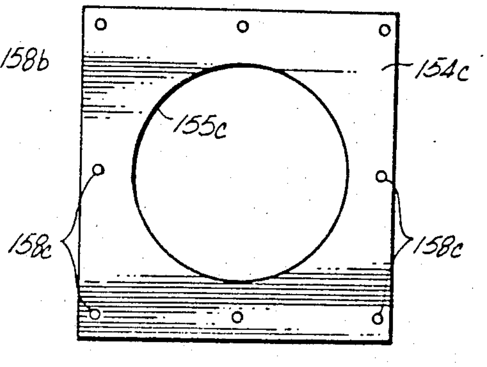
FIG. 14 is an elevation view showing a secondary chamber panel as viewed on line 14—14 of FIG. 10.

FIGS. 12 through 14 illustrate the configuration of first, second, and third panels **154*a*, 154*b* and 154*c*, respectively, of the secondary chamber housing 144. These views show drill holes 158*a*, 158*b* and 158*c* which are aligned with one another for receiving the through bolts 156. A loudspeaker 160 is sealed in an airtight manner to the inside face of the first panel 158*a*. The loudspeaker includes an annular mounting flange 162 affixed to the inside face of the first panel by circumferentially spaced apart screws 164. Holes 166 are spaced apart around the periphery of a central opening 155*a* in the first panel for receiving the screws 164 for affixing the loudspeaker mounting flange to the panel. The cone of the loudspeaker 160 projects into the hollow interior 150 of the secondary chamber housing. In a preferred embodiment, the length of the secondary chamber housing interior is greater than the length of the speaker cone. The openings in the panels are preferably of varying diameter, so that the hollow interior of the secondary chamber progressively tapers narrower generally with the taper of the speaker cone. This provides a progressively greater wall thickness of the secondary chamber housing in a direction from the loudspeaker toward the primary chamber housing. In the illustrated embodiment, the diameter of the central opening 155*a* in the first panel is about the same as the diameter of the speaker cone. The opening 155*b* in the second panel 154*b* is slightly larger to accommodate the mounting flange of the loudspeaker. The opening 155*c* in the third panel 154*c* is about the same as the diameter of the opening in the first panel. The central openings in the fourth through the seventh panels are smaller than the diameter of the third panel to provide the greater wall thickness. The eighth or inside panel has an even smaller inside diameter providing a small opening 155' adjacent the port 152 of the primary chamber housing. The smaller diameter of the inside opening 155' provides an annular flange 157** which acts as a resonance damper and aids in lowering the resonant frequency of the system.

An an alternative, the stacked panels can be adhesively bonded to one another and bonded to the front face of the primary chamber housing in the absence of through bolts or the like.

The walls of the secondary chamber are of sufficiently large mass that vibrations from the loudspeaker during operation do not cause physical movement or vibrations of the primary chamber housing. Stated another way, the secondary chamber housing is of sufficiently large mass that it resists forces trying to move it when vibrations are produced in the loudspeaker during its operation. This resistance prevents motion or vibrations from being transmitted to the walls of the primary chamber from the speaker; and as a result, a pure sound is produced by the loudspeaker with no false effect being induced by the speaker enclosure.

This large mass of the secondary chamber housing can be provided by a number of arrangements. In the illustrated embodiment, the average wall thickness of the secondary chamber housing is substantially greater than the average wall thickness of the primary chamber housing. The secondary chamber housing also is substantially longer than the average wall thickness of the primary chamber housing. Thus, the density of the secondary chamber housing is substantially greater than the density of the primary chamber housing. To provide a sufficiently large mass, the mass of the secondary chamber housing is at least twice the mass of the primary chamber housing. Although the mass or density of the secondary chamber housing has been compared to that of the primary chamber housing, it should be understood that this comparison is with respect to the illustrated embodiment. The desired large mass or density of the secondary chamber is actually an absolute value, i.e., that which is sufficient to inhibit physical motion or vibration being transmitted to the walls of the secondary chamber housing from vibrations induced in the loudspeaker during its operation. This desired large mass is also provided in the illustrated embodiment by the volume occupied by the walls of the secondary chamber housing being substantially greater than the volume occupied by the hollow interior of the secondary chamber.

FIGS. 15 through 17 show alternative embodiments of the loudspeaker enclosure illustrated in FIGS. 10 to 14. FIG. 15 shows a loudspeaker enclosure having a primary chamber housing 166 similar to the primary chamber housing 142. The secondary chamber housing 168 is constructed from a plurality of overlapping panels 170 of a rigid, dense material such as particle board. The panels 170 are substantially the same height as the primary chamber, providing an extremely rigid high density enclosure surrounding a minor interior volume 172 of the secondary chamber. A loudspeaker 174 is sealed to the front portion of the secondary chamber housing, and the hollow interior of the secondary chamber opens directly into the hollow interior of the primary chamber.

FIG. 16 shows an embodiment having a primary chamber housing 176 and a secondary chamber housing 178 mounted inside the hollow interior of the primary chamber. In this embodiment, the secondary chamber comprises a series of overlapping panels 180 having central openings arranged to provide a hollow interior space 182 inside the secondary chamber. This hollow interior space communicates coaxially with an opening 184 in a front wall 186 of the primary chamber. An opening 188 in the secondary chamber housing provides direct communication between the hollow interior of the secondary chamber and the hollow interior of the primary chamber. A loudspeaker 190 is mounted inside the secondary chamber housing and faces outward toward the exterior of the enclosure. In this arrangement, the speaker mounting opening is considered exterior of the primary chamber.

FIG. 17 shows an embodiment having a primary chamber housing 192 and a composite secondary chamber housing 194 on both sides of a front wall 196 of the primary chamber. The secondary chamber has an exterior portion comprising a plurality of stacked panels 198 of particle board rigidly affixed to the front wall of the primary chamber. These panels have openings forming a hollow interior coaxial with a port 200 in the front wall of the primary chamber. The secondary chamber also has an interior portion comprising a plurality of stacked panels 202 of particle board rigidly affixed to the inside face of the front wall 196. These inside panels have a hollow interior also coaxial with the port 200 in the primary chamber front wall. The composite secondary chamber has an exterior opening to which a loudspeaker 204 is sealed and an interior opening 206 located in the hollow interior of the primary chamber. The inside chamber, in an alternative embodiment, can be made from a rigid tube, rather than stacked panels, if desired.

In each of the embodiments illustrated in FIGS. 10 through 17, the speaker mounting opening is the only opening from the exterior of the enclosure to the interior of the primary and secondary chambers; and the speaker mounting opening is open essentially directly from the interior of the secondary chamber to the exterior of the loudspeaker enclosure.

In one embodiment of the loudspeaker shown in FIGS. 10 through 14, a ten-inch bass speaker or woofer was mounted to the front wall of a minor chamber housing having overall dimensions of 14 inches high×14 inches wide×6 inches deep. The primary chamber housing had dimensions of about 24 inches high×16 inches wide×16 inches deep. The panels comprising the secondary chamber housing were ¾-inch thick particle board. The primary chamber comprised ¾-inch thick particle board. This loudspeaker, when played in the bass range, i.e., below about 100 Hz, produced surprisingly clean sound essentially free of vibrations induced in the wall of the enclosure, even when the speaker was operated at high volume.

The panels in the secondary chamber housing can be constructed from materials having acoustical properties selected to provide a particular sound or bass response. For example, the material comprising the panels can differ from one another to produce a desired bass response. For instance, the speaker illustrated in FIG. 15 is an example, in which one or more panels 170' are made from a flexible or resiliant material, such as polyurethane foam, and the other panels 170" are made from a rigid material, such as particle board. This enclosure can produce a different and possibly desirable bass response, when compared with a secondary chamber housing having all panels made from the same material.

In one embodiment, the entire wall structure of the secondary chamber housing can be made from a single continuous piece of material, rather than being laminated as illustrated in the drawings. However, it is presently believed that the laminated outer wall of the secondary chamber housing provides best results, because the intersections between panels tend to dampen or disrupt vibrations being induced in the wall of the secondary chamber. It is also believed that the resin particles in the particle board aid in creating a deadening effect in producing essentially no vibrations or physical motion of the wall of the secondary chamber in response to vibrations from the loudspeaker.

Figure 18:
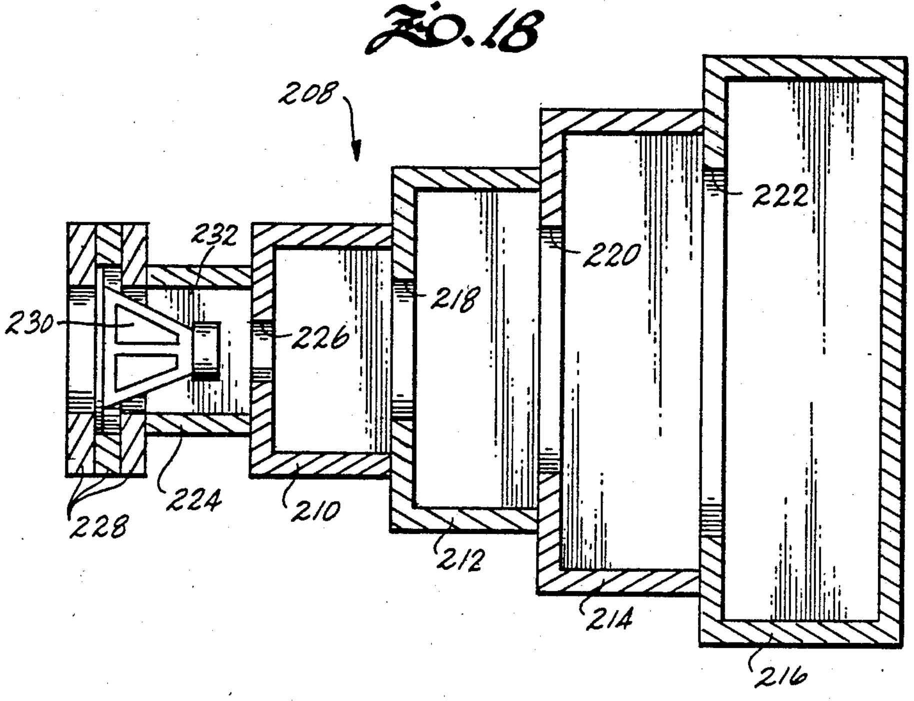
FIG. 18 is a cross-sectional view showing a loudspeaker enclosure particularly useful in reproducing sound in the bass range and having several primary chambers of different size.

FIG. 18 shows a loudspeaker enclosure 208 having a primary chamber housing comprising a plurality of progressively larger primary chamber enclosures 210, 212, 214 and 216. The smallest primary chamber enclosure 210 has a hollow interior that communicates with the secondary enclosure through an opening 218. The second enclosure communicates with the hollow interior of the third enclosure 214 through a similar but larger opening 220, and the third enclosure communicates with the hollow interior of the fourth enclosure through an even larger opening 222. The loudspeaker enclosure also includes a secondary chamber housing comprising a tubular wall section 224 rigidly affixed to the front wall of the first primary chamber enclosure coaxially with an opening 226 in the front wall of the first enclosure. A plurality of stacked wall panels 228 are rigidly affixed to the front end of the tubular wall section 224 to provide a rigid, high density composite mounting board for a loudspeaker 230. In this embodiment, a hollow interior 232 of the secondary chamber opens directly into a hollow interior with the combination provided by the four primary chamber enclosures. The embodiment in FIG. 18 has an improved freedom from resonance, which is believed to be provided by the composite primary chamber housing, in which each additional enclosure added to the combination lowers the overall resonant frequency of the system. In addition, the extremely rigid, high density mounting provided for the loudspeaker by the secondary chamber wall structure inhibits vibration or physical motion being transmitted from the speaker to the walls of the speaker housing. As a further alternative, the multiple primary chambers can be replaced with a single primary chamber that tapers larger in volume away from the secondary chamber.

The foregoing description has been made with reference to certain specific enclosure structures which are the enclosure arrangement that I presently prefer. Persons skilled in the art to which this invention pertains will understand that the principles of my development can be adapted in enclosures of different specific arrangements. Therefore, the foregoing description is principally illustrated and should not be regarded as restructing this invention in scope only to the particular enclosures which have been described.

What is claimed is:

1. A loudspeaker enclosure comprising a primary chamber having a principal interior volume and a secondary chamber having a minor interior volume substantially smaller than the principal interior volume, the primary chamber having a front wall, the secondary chamber comprising an elongated housing sealed to the primary chamber, the secondary chamber housing having a speaker mounting opening exterior of the primary chamber and an interior opening that opens directly from the interior of the secondary chamber into the interior of the primary chamber, the secondary chamber having an outer wall defining a speaker mounting opening and which is defined, configured and arranged relative to the wall of the primary chamber housing to inhibit the transmission of vibrations induced in a loudspeaker mounted in the speaker mounting opening, the speaker mounting opening being open essentially directly from the interior of the secondary chamber to the exterior of the enclosure.

2. A loudspeaker enclosure according to claim 1 in which the volume occupied by the wall of the secondary chamber housing is greater than the minor interior volume.

3. A loudspeaker enclosure according to claim 1 in which the secondary chamber housing has a greater wall thickness than the structure defining the primary chamber.

4. A loudspeaker enclosure according to claim 3 in which the secondary chamber housing has a mass greater than the mass of the structure defining the primary chamber.

5. A loudspeaker enclosure according to claim 1 in which the wall of the secondary chamber housing has greater mass than the wall of the primary chamber.

6. A loudspeaker enclosure according to claim 1 in which the length of the secondary chamber housing is substantially greater than the average wall thickness of the primary chamber front wall.

7. A loudspeaker enclosure according to claim 1 in which the secondary chamber housing projects beyond at least one face of the primary chamber front wall.

8. A loudspeaker enclosure according to claim 1 in which the secondary chamber housing is formed by a plurality of overlapping panels, with openings in the panels forming the minor interior volume.

9. A loudspeaker enclosure according to claim 8 in which the average wall thickness of the secondary chamber is greater than the average wall thickness of the housing formed by the primary chamber.

10. A loudspeaker enclosure according to claim 8 in which the secondary chamber housing is longer than the average wall thickness of the primary chamber front wall.

11. A loudspeaker enclosure according to claim 1 in which the speaker mounting opening is spaced forward of the primary chamber front wall.

12. A loudspeaker enclosure according to claim 1 in which the speaker mounting opening is generally in the plane of the primary chamber front wall, and the interior opening of the secondary chamber is spaced inside from the primary chamber front wall.

13. A loudspeaker enclosure according to claim 1 in which the interior opening of the secondary chamber has an average dimension less than the average dimension of the speaker mounting opening.

14. A loudspeaker enclosure according to claim 1 in which the speaker mounting opening is the only opening from the exterior of the enclosure to the interior of the primary and secondary chambers.

15. A loudspeaker enclosure according to claim 1 in which the primary chamber comprises a second housing having a first relatively smaller volume that opens into a second relatively larger volume, and in which the secondary chamber housing is mounted to a front wall of the portion of the second housing defining said relatively smaller volume.

16. A loudspeaker enclosure useful with plural loudspeakers comprising (a) for each loudspeaker, an individual enclosure comprising a primary chamber defining a principal interior volume and a secondary chamber defining a minor interior volume substantially smaller than the principal interior volume, the primary chamber having a front wall with outer and inner faces, the inner face forming a front boundary of selected height and width dimensions for the principal volume, the secondary chamber comprising an elongated housing essentially permanently sealed to the front wall of the primary chamber and projecting beyond at least one of the faces of the primary chamber front wall, the secondary chamber housing defining a speaker mounting opening which opens essentially directly to the exterior of the enclosure from a front boundary of the minor volume, the enclosure defining a second simple opening that opens simply and directly from the minor interior volume only to the principal interior volume substantially coaxially of the speaker mounting opening through a rear boundary of the minor interior volume, the speaker mounting opening being the only opening from the combination of the primary and secondary chambers to the exterior of the enclosure, the second opening having height and width dimensions which are less than and are in directions respectively parallel to the height and width dimensions of the principal volume front boundary, the minor volume between the speaker mounting and second openings having a length dimension substantially greater than the length of a loudspeaker mountable in the speaker mounting opening, (b) each speaker mounting opening being the only opening to the exterior of the respective individual enclosure from the combination of its primary and secondary chambers, (c) each adjacent pair of individual enclosures having a common wall sealing the primary chambers thereof from one another, (d) each primary chamber having a principal volume different from the other primary chambers.

17. A loudspeaker enclosure comprising a primary chamber defining a principal interior volume and a secondary chamber defining a minor interior volume substantially smaller than the principal interior volume, the primary chamber having a front wall with outer and inner faces, the inner face forming a front boundary of selected height and width dimensions for the principal volume, the secondary chamber comprising an elongated housing essentially permanently sealed to the front wall of the primary chamber and projecting beyond at least one of the faces of the primary chamber front wall, the secondary chamber housing defining a speaker mounting opening which opens essentially directly to the exterior of the enclosure from a front boundary of the minor volume, the enclosure defining a second simple opening that opens simply and directly from the minor interior volume only to the principal interior volume substantially coaxially of the speaker mounting opening through a rear boundary of the minor interior volume, the speaker mounting opening being the only opening from the combination of the primary and secondary chambers to the exterior of the enclosure, the second opening having height and width dimensions which are less than and are in directions respectively parallel to the height and width dimensions of the principal volume front boundary, the minor volume between the speaker mounting and second openings having a length dimension substantially greater than the length of a loudspeaker mountable in the speaker mounting opening, and in which the primary chamber comprises a housing having a first relatively smaller volume next-adjacent the minor volume that opens into a second relatively larger volume.

18. A loudspeaker enclosure according to claim 17 in which the secondary chamber housing is mounted to a front wall of a housing defining the first volume of the primary chamber housing.

19. A loudspeaker enclosure comprising a primary chamber defining a principal interior volume and a secondary chamber defining a minor interior volume substantially smaller than the principal interior volume, the primary chamber having a front wall with outer and inner faces, the inner face forming a front boundary of selected height and width dimensions for the principal volume, the secondary chamber comprising an elongated housing essentially permanently sealed to the front wall of the primary chamber and projecting beyond at least one of the faces of the primary chamber front wall, the secondary chamber housing defining a speaker mounting opening which opens essentially directly to the exterior of the enclosure from a front boundary of the minor volume, the enclosure defining a second simple opening that opens simply and directly from the minor interior volume only to the principal interior volume substantially coaxially of the speaker mounting opening through a rear boundary of the minor interior volume, the speaker mounting opening being the only opening from the combination of the primary and secondary chambers to the exterior of the enclosure, the second opening having height and width dimensions which are less than and are in directions respectively parallel to the height and width dimensions of the principal volume front boundary, the minor volume between the speaker mounting and second openings having a length dimension substantially greater than the length of a loudspeaker mountable in the speaker mounting opening, the structure defining the secondary housing having a density at least twice as great as the density of the structure defining the primary chamber.

20. A loudspeaker enclosure according to claim 19 in which the average wall thickness of the structure defining the secondary chamber is greater than the average wall thickness of the structure defining the primary chamber.

21. A loudspeaker enclosure comprising a primary chamber defining a principal interior volume and a secondary chamber defining a minor interior volume substantially smaller than the principal interior volume, the primary chamber having a front wall with outer and inner faces, the inner face forming a front boundary of selected height and width dimensions for the principal volume, the secondary chamber comprising an elongated housing essentially permanently sealed to the front wall of the primary chamber and projecting beyond at least one of the faces of the primary chamber front wall, the secondary chamber housing defining a speaker mounting opening which opens essentially directly to the exterior of the enclosure from a front boundary of the minor volume, the enclosure defining a second simple opening that opens simply and directly from the minor interior volume only to the principal interior volume substantially coaxially of the speaker mounting opening through a rear boundary of the minor interior volume, the speaker mounting opening being the only opening from the combination of the primary and secondary chambers to the exterior of the enclosure, the second opening having height and width dimensions which are less than and are in directions respectively parallel to the height and width dimensions of the principal volume front boundary, the minor volume between the speaker mounting and second openings having a length dimension substantially greater than the length of a loudspeaker mountable in the speaker mounting opening, the average wall thickness of the structure defining the secondary chamber being greater than the average wall thickness of the structure defining the primary chamber.

22. A loudspeaker enclosure comprising a primary chamber defining a principal interior volume and a secondary chamber defining a minor interior volume substantially smaller than the principal interior volume, the primary chamber having a front wall with outer and inner faces, the inner face forming a front boundary of selected height and width dimensions for the principal volume, the secondary chamber comprising an elongated housing essentially permanently sealed to the front wall of the primary chamber and projecting beyond at least one of the faces of the primary chamber front wall, the secondary chamber housing defining a speaker mounting opening which opens essentially directly to the exterior of the enclosure from a front boundary of the minor volume, the enclosure defining a second simple opening that opens simply and directly from the minor interior volume only to the principal interior volume substantially coaxially of the speaker mounting opening through a rear boundary of the minor interior volume, the speaker mounting opening being the only opening from the combination of the primary and secondary chambers to the exterior of the enclosure, the second opening having height and width dimensions which are less than and are in directions respectively parallel to the height and width dimensions of the principal volume front boundary, the minor volume between the speaker mounting and second openings having a length dimension substantially greater than the length of a loudspeaker mountable in the speaker mounting opening, the secondary chamber housing having a wall in which the speaker mounting opening is defined and which has substantially greater rigidity than the rigidity of the front wall of the primary chamber.

23. A loudspeaker enclosure comprising a primary chamber defining a principal interior volume and a secondary chamber defining a minor interior volume substantially smaller than the principal interior volume, the primary chamber having a front wall with outer and inner faces, the inner face forming a front boundary of selected height and width dimensions for the principal volume, the secondary chamber comprising an elongated housing essentially permanently sealed to the front wall of the primary chamber and projecting beyond at least one of the faces of the primary chamber front wall, the secondary chamber housing defining a speaker mounting opening which opens essentially directly to the exterior of the enclosure from a front boundary of the minor volume, the enclosure defining a second simple opening that opens simply and directly from the minor interior volume only to the principal interior volume substantially coaxially of the speaker mounting opening through a rear boundary of the minor interior volume, the speaker mounting opening being the only opening from the combination of the primary and secondary chambers to the exterior of the enclosure, the second opening having height and width dimensions which are less than and are in directions respectively parallel to the height and width dimensions of the principal volume front boundary, the minor volume between the speaker mounting and second openings having a length dimension substantially greater than the length of a loudspeaker mountable in the speaker mounting opening, the volume occupied by the walls of the secondary chamber housing being greater than the volume of the secondary chamber.

* * * * *